United States Patent [19]
Finger

[11] 3,992,668
[45] Nov. 16, 1976

[54] ELECTRO-THERMAL READOUT OF COULOMETERS

[75] Inventor: Eugene P. Finger, Brewster, N.Y.

[73] Assignee: Curtis Instruments, Inc., Mount Kisco, N.Y.

[22] Filed: July 9, 1975

[21] Appl. No.: 594,352

Related U.S. Application Data

[63] Continuation-in-part of Ser. No. 538,464, Jan. 3, 1975.

[52] U.S. Cl. .............................. 324/94; 73/362 AR; 235/183; 328/127; 340/227 D
[51] Int. Cl.² ............................................. G01R 27/22
[58] Field of Search ............. 324/94, DIG. 1, 227 D, 324/233; 340/227 D, 233; 73/362 AR; 328/127; 235/183

[56] References Cited
UNITED STATES PATENTS

| | | |
|---|---|---|
| 3,533,026 | 10/1970 | Klock ............................... 324/94 X |
| 3,602,813 | 8/1971 | Beuseman ...............................324/94 |
| 3,612,535 | 10/1971 | Davis et al. ................ 73/362 AR X |
| 3,686,566 | 8/1972 | Beusman............................... 324/94 |
| 3,732,443 | 5/1973 | Lovrenich ...................... 324/DIG. 1 |
| 3,737,886 | 6/1973 | Dinges ............................ 340/233 X |
| 3,818,758 | 6/1974 | Easter.............................. 324/DIG. 1 |

Primary Examiner—Stanley T. Krawczewicz
Attorney, Agent, or Firm—Pennie & Edmonds

[57] ABSTRACT

Systems are disclosed for reading the integral stored in a coulometer by sensing the thermal properties of the electrolyte. A preferred embodiment comprises at least one temperature sensitive element and a heat source placed adjacent the coulometer positioned in such a manner with respect to each other that the heat conduction path extends through a portion of the coulometer. The thermal conductivity of the path is changed by the migration of the electrolyte into that portion of the coulometer that includes the conduction path.

16 Claims, 5 Drawing Figures

ELECTRO-THERMAL READOUT OF COULOMETERS

CROSS REFERENCE TO RELATED APPLICATION

This application is a continuation-in-part of U.S. Application Ser. No. 538,464, entitled "Electro-Thermal Readout Coulometer," filed Jan. 3, 1975.

BACKGROUND OF THE INVENTION

The present invention relates to electrochemical devices known as coulometers and more specifically to coulometer-type instrument which is capable of measuring and indicating the total electrical current that has been conducted through an electrical circuit.

Coulometers are described in detail in Lester Corrsin's U. S. Reissue Pat. No. Re. 27,556 entitled "Operating Time Indicator" and Curtis Beusman's U. S. Pat. No. 3,193,763 entitled "Electrolytic Coulometric Current Integrating Device," both of which are incorporated herein by reference.

The device described in these patents includes a tubular body of nonconductive material having a bore therethrough that supports two columns of a liquid metal such as mercury. The adjacent innermost ends of these columns are separated by a small volume of electrolyte with which they make conductive contact. The outermost ends of the liquid metal columns contact conductive leads that connect the instrument to the source of electric current that is to be measured. In accordance with Faraday's Law, when current flows through the instrument, liquid metal is electroplated from the anode column to the cathode column causing the anode to decrease in length and the cathode to increase an equal amount, the change in column length being directly proportional to the total electric charge passed through the instrument. Of course, this change in column length also represents a change in the position of the electrolyte along the length of the coulometer.

Readout of the total current through the instrument may be made by comparing the length of a column against a calibrated scale. Typical visual readout devices are described in the above-identified Corrsin Patent and in Beusman's U.S. Pat. No. 3,343,083 entitled "Nonself-Destructive Reversible Electrochemical Coulometer." It has also been found that the coulometer may be read out electrically by measuring changes in the capacitance between the mercury columns and an electrode surrounding the tubular body. The details of such a readout device are set forth in Edward Marwell and Curtis Beusman's U.S. Pat. No. 3,255,413 entitled "Electro-Chemical Coulometer Including Differential Capacitor Measuring Elements" and Eugene Finger's U.S. Pat. Nos. 3,704,431 and 3,704,432 entitled "Coulometer Controlled Variable Frequency Generator" and "Capacitive Coulometer Improvements," respectively, all of which are incorporated herein by reference.

SUMMARY OF THE INVENTION

The present invention is a method and apparatus for reading a coulometer by sensing the temperature of the electrolyte.

I have found that when electricity is passed through a coulometer, the electrolyte dissipates most of the electrical energy and therefore rises in temperature relative to the mercury columns. Thus, the position of the electrolyte and hence the integral stored in the coulometer may be read by placing one or a number of heat-sensitive devices along the length of the coulometer. In one preferred embodiment, a pair of thermosensitive devices are placed in thermal contact with the surface of a coulometer tube and spaced apart from each other. These thermosensitive devices have a resistance which varies as a function of temperature. The thermoresistive devices are coupled to a circuit, such as a conventional Wheatstone bridge, which detects the difference between their resistances when they are at different temperatures. Thus, if the electrolyte has moved to a position adjacent one of the thermoresistive devices, the output of the bridge will change with a given polarity. Similarly, if the electrolyte has moved to a position adjacent the other thermoresistive device, the output of the bridge will change with opposite polarity. This change in the output of the bridge may be detected using any conventional circuit, such as a differential amplifier.

In some cases, where the temperature difference between the electrolyte and the mercury columns is not large enough to be easily detected, it has been found desirable to pass an AC signal through the coulometer. This signal, while it does cause the electrolyte to dissipate additional power and thus rise to and even higher temperature, has no effect on the overall integration process, since it has no DC component.

In accordance with an additional preferred embodiment of the invention, means other than the application of an AC current to the coulometer may be used to cause differential temperature effects which are related to the position of the electrolyte in the coulometer. For example, the coulometer may be subjected to an external source of heat and the change in thermal conductivity of a localized portion of the coulometer body with the change in position of the electrolyte may be monitored to determine the position of the electrolyte.

Although the coulometer may be externally heated by any of a number of techniques, such as making use of a heated portion of a motor whose use is being monitored, the preferred embodiment contemplates the use of a simple electro-thermal source. This souce is placed adjacent the coulometer in such a manner that a thermo-conductive path extends through the coulometer body between the electro-thermal source and the thermoelectric detector. The proximity of the electrolyte to the source-detector combination is sensed when the electrolyte advances into the path between the source and the detector. Due to the fact that the electrolyte is a poor conductor of heat as compared to mercury, the detector senses a reduction in the amount of heat received from the source.

DETAILED DESCRIPTION OF THE PREFERRED EMBODIMENT

Figure 1:
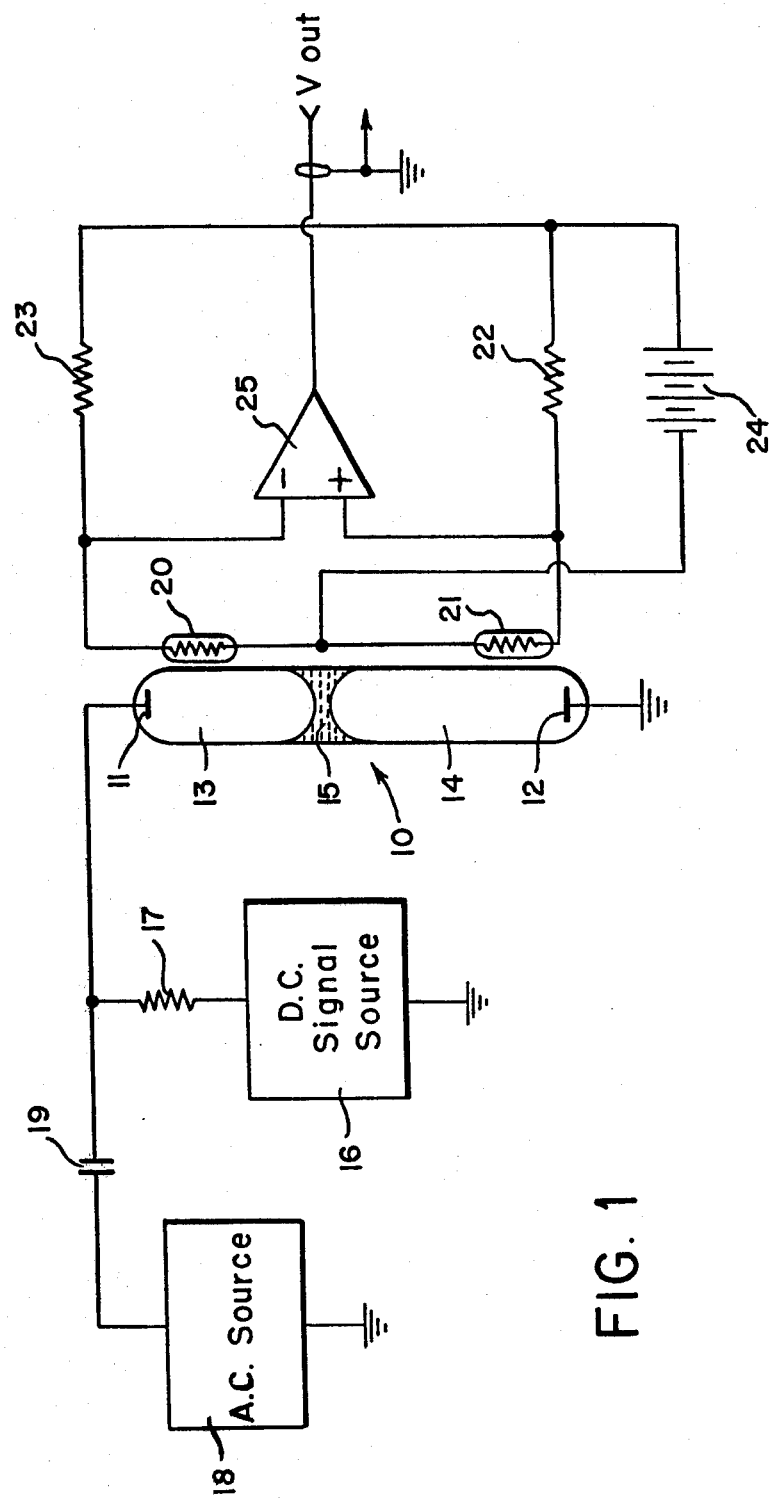
FIG. 1 is a schematic diagram of a coulometer with a readout system constructed in accordance with the present invention.

Referring to FIG. 1, there is illustrated a coulometer 10 which includes electrodes 11 and 12 at opposite ends of the coulometer body. Columns of mercury 13 and 14 are in contact with electrodes 11 and 12 respectively. A quantity of electrolyte 15 is disposed in the gap between the two columns of mercury. Thus, the two columns of mercury 13 and 14 and electrolyte 15 are in seris connection with electrodes 11 and 12. A DC signal source 16 supplies a current proportional to the quantity to be integrated. If desired, a metering resistor 17 may be included in series with signal source 16 in order to limit the DC current passing through the coulometer and thus make the period of integration larger. Alternatively, a resistor could be put in parallel with source 16, or any other well known metering technique could be used.

As signal source 16 passes electricity through coulometer 10, mercury is plated from the anode electrode of the coulometer to its cathode electrode. This causes the electrolyte 15 between mercury columns 13 and 14 to move from one electrode to the other in a direction dependent upon the polarity of signal source 16. In a given circuit, one may even be able to vary the polarity of signal source 16 and thus vary the direction of integration.

An AC source 18 is coupled via capacitor 19 to coulometer 10. AC source 18 produces an AC current which passes through the coulometer causing the electrolyte 15 to dissipate additional energy and rise in temperature. As discussed above, if enough current is produced by DC signal source 16, it is unnecessary to add a separate AC source in order to raise the temperature of electrolyte 15. However, in many applications, integration may proceed very slowly and the amount of current passing through the coulometer without the addition of the AC source is relatively small and produces a heat change in the electrolyte which is relatively difficult to detect. In these situations, it is therefore often advantageous to use an AC source, such as source 18, to raise the temperature of the electrolyte without affecting integration.

A pair of thermoresistive devices, such as thermistors 20–21, are placed in thermal contact with coulometer 10. These two thermistors are wired into a Wheatstone bridge along with fixed resistors 22 and 23, as illustrated in the figure. The bridge is provided with power by a battery 24. The output of the bridge is coupled to a differential amplifier 25. When the electrolyte moves to a position adjacent thermistor 20 or 21, the thermistor adjacent the electrolyte will heat up and change its resistance. This causes an unbalance in the bridge and a resultant voltage change at the input terminals of differential amplifier 25. The polarity of this voltage change depends upon whether the electrolyte 15 is in contact with thermistor 20 or 21. The output of differential amplifier 25 will vary dependent upon the polarity of the signal at its input terminals.

Naturally, the response of amplifier 25 will depend on a number of system characteristics. These characteristics include the width of the gap filled by electrolyte 15, the dimensions of the thermistor, the thermal conductivity and dimensions of the tubular body of the coulometer, and the thermal nature of the systems' immediate environment. The transition region can be minimized for digital functions such as time delay switches, cycle timers and precise end-of-integral determination by making the distance between the thermistors large in comparison with the gap and the dimensions of the thermistors. Conversely, the transition region can be expanded for analog uses such as integration and proportional control analog memory by making the distance between the thermistors small in comparison with the gap and the dimensions of the thermistors. The shape of the transition region may also be tailored through dimensional control and thermal design.

Figure 2:
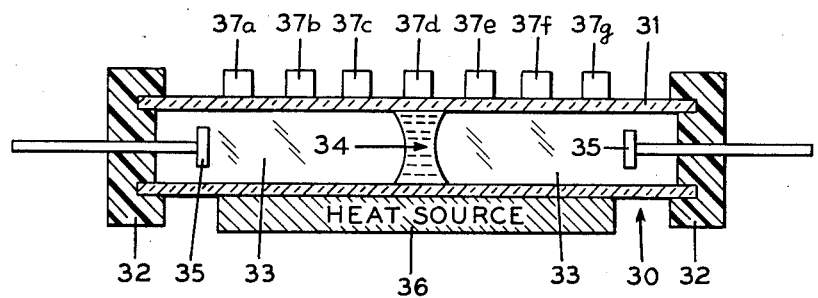
FIGS. 2–5 illustrate various coulometers using alternative readout schemes.

An alternative electro-thermal technique for the readout of a coulometer is illustrated in FIG. 2. In accordance with this technique, the coulometer 30 comprises a glass envelope 31 and a pair of endcaps 32. Contained within the tubular or elongated body 31 are two columns of mercury 33 and a quantity of electrolyte 34. A pair of electrodes 35 are positioned at opposite sides of the coulometer 30.

The operation of the coulometer illustrated in FIG. 2 is similar to that of the coulometer illustrated in FIG. 1 inasmuch as the position of the electrolyte 34 is proportional to the stored integral. The position of the electrolyte is detected by measuring its thermal conductivity relative to the thermal conductivity of the mercury columns. The thermal conductivity is measured using a distributed heat source 36 and a plurality of temperature sensing elements 37a–g.

Insofar as the thermal conductivity of the electrolyte 34 is significantly less than the thermal conductivity of mercury columns 33, a thermosensitive detector adjacent the electrolyte will not receive as much heat as a thermosensitive detector adjacent the mercury columns. Thus, the thermal path through electrolyte 34 between heat source 36 and thermosensitive detector 37d will not conduct as much heat as the paths which extend through the mercury columns between the heat source and thermosensitive detectors 37a–c and 37e–g. It is thus seen that thermosensitive detector 37d will detect a temperature smaller than that detected by thermosensitive detectors 37a–c and 37e–g. This difference may be detected by appropriate circuitry which may be used to drive any desired display for indicating the integral stored in the coulometer.

Figure 3:
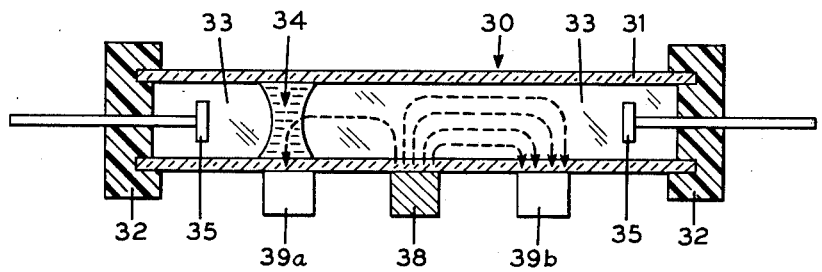

Another embodiment of a coulometer reading system using an external heat source is illustrated in FIG. 3. This system is particularly useful for situations where it is desired to keep the integral which one is monitoring within a given range. The coulometer 30 used in FIG. 3 is identical to the one used in FIG. 2 and comprises a glass envelope 31, a pair of endcaps 32, two columns of mercury 33, a quantity of electrolyte 34 and a pair of electrodes 35. The position of electrolyte 34 is detected using a point source of heat 38 and a pair of thermosensitve detectors 39a–b.

If the stored integral is at the desired value, electrolyte 34 is adjacent heat source 38. As a consequence of this, any heat passing from the heat source to thermosensitive detectors 39a–b must pass through the electrolyte 34. Since electrolyte 34 is a relatively poor conductor of heat, when the electrolyte is in the central position adjacent the heat source, thermosensitive heat detectors 39a–b will have a relatively low temperature. If, however, the electrolyte were to migrate from the center position as is illustrated in FIG. 3, a relatively good continuous path will exist between the heat source and one of the thermosensitive detectors. This situation is illustrated in FIG. 3 wherein a relatively high quality thermoconductive path between source 38 and themosensitive detector 39b results in a significant difference between the temperature sensed by detectors 39a–b. Thus, when electrolyte 34 migrates to an off-center position, as is illustrated in FIG. 3, the difference in the temperatures sensed by detectors 39a and 39b will activate appropriate control circuitry to restore and maintain electrolyte 34 in a central position.

Figure 4:
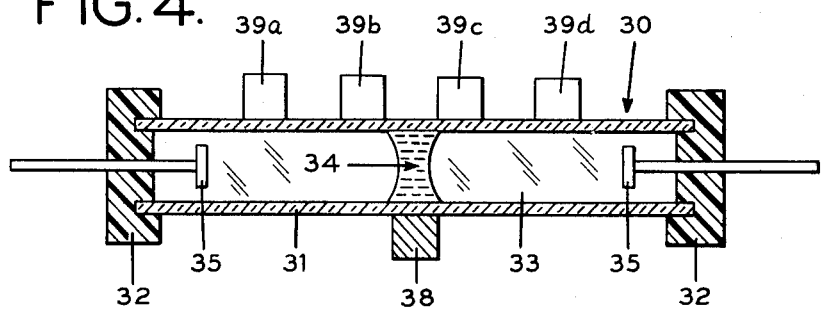

Such a control function can be enhanced by using control circuitry responsive to the stored integral to correct the value of that integral at two different rates. The first of these rates would correspond to minor deviations in the value of the integral and would be relatively slow and the second of these rates would correspond to large deviations in the value of the integral and would be relatively fast. A coulometer particularly suited for this sort of operation is illustrated in FIG. 4. The coulometer illustrated in FIG. 4 is substantially identical to the coulometer illustrated in FIG. 3 with the difference that the thermal detectors 39a–d and heat source 38 are situated on opposite sides of the coulometer. Detectors 39b and c correspond to relatively minor deviations in the value of the integral while detectors 39a and d correspond to relatively large deviations from the desired value of the integral.

Figure 5:
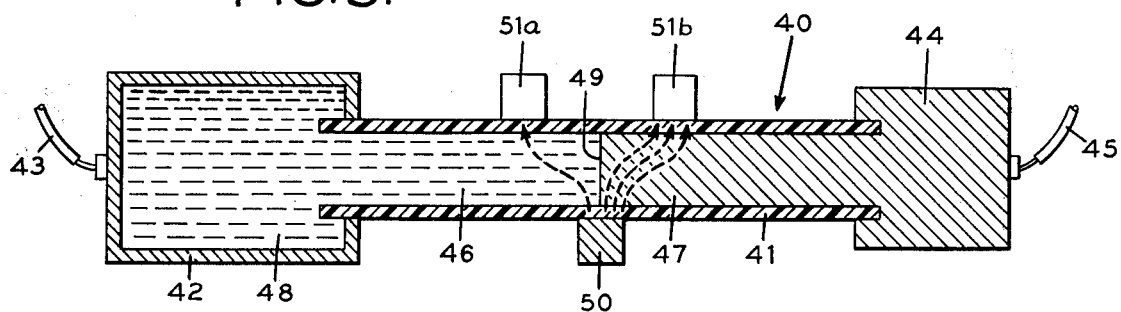

It is also noted that the electro-thermal techniques of the invention are applicable to a wide variety of coulometers. For example, as is illustrated in FIG. 5, a copper coulometer may be read using an electro-thermal technique. The copper coulometer 40 comprises a coulometer tube 41 which is made of a non-conducting material. A copper enclosure 42 closes one end of the coulometer and is coupled by conductor 43 to an external circuit. The other end of the coulometer is closed by a copper body 44 which is coupled to an external circuit by conductor 45. The coulometer is filled with a quantity of electrolyte 46. Electrolyte 46 extends from enclosure 42 through coulometer tube 41. Tube 41 also includes a column 47 of copper which is integral with copper body 44.

When current is passed through coulometer 40 via conductors 43 and 45, copper is either removed from column 47 and plated onto the inside surface 48 of enclosure 42 or removed from the inside surface 48 and plated onto the column 47, dependent upon the direction of current flow through the device.

The position of the junction or interface 49 between copper column 47 and electrolyte 46 is detected by monitoring the conductivity between a heat source 50 and thermosensitive detectors 51a–b. The operation of heat source 50 and detectors 51a–b is similar to the operation of those devices in the systems illustrated in FIGS. 2–4. When junction 49 is in the centered position, the thermoconductivity of the path between heat source 50 and detector 51a is relatively poor while the thermoconductivity between heat source 50 and detector 51b is of a relatively higher quality. Should junction 49 migrate substantially either to one side or the other, this relationship will be altered. Such alteration can be readily detected by appropriate circuitry connected to detectors 51a–b.

While a preferred embodiment of the invention has been described, it is understood that various changes and modifications will be obvious to those skilled in the art. For example, the thermoresistive devices may be replaced by thermoelectrical devices or even conventional semiconductor devices which exhibit variations in their characteristics with temperature. It is contemplated that these changes are within the scope of the invention as defined by the following claims.

I claim:

1. An integrating circuit for integrating a current, comprising:
    a. coulometer which includes:
        i. an elongated electrically non-conducting body defining a bore;
        ii. a first column of liquid metal disposed in said elongated body;
        iii. a second column of liquid metal disposed in said elongated body;
        iv. a quantity of electrolyte disposed between said first column of metal and said second column of metal, said electrolyte defining a region which moves along the length of the coulometer when the coulometer is subjected to a DC current;
        v. a first electrode in contact with said first column of metal; and
        vi. a second electrode in contact with said second column of metal;
    b. means for subjecting said coulometer to an external source of heat;
    c. at least one thermosensitive device disposed adjacent said coulometer at a first point between said first and second electrodes of said coulometer; and
    d. circuit means coupled to said thermosensitive device for providing a signal when the temperature sensed by said thermosensitive device changes.

2. An integrating circuit as in claim 1, wherein the external source of heat is supplied by a heat source disposed adjacent said coulometer at a second point between said first and second electrodes of said coulometer.

3. An integrating circuit as in claim 1, wherein said quantity of electrolyte has a thermal conductivity different from the thermal conductivity of the metal in each of said columns.

4. An integrating circuit as in claim 3, wherein said thermosensitive device is positioned such that a heat conduction path is formed between the heat source and said thermosensitive device, whereby the amount of heat detected by said thermosensitive device will be affected by the interposition of the electrolytic region between the heat source and said thermosensitive device and thus the position of said region can be detected.

5. An integrating circuit as in claim 1, wherein the metal in each of said columns is mercury.

6. An integrating circuit as in claim 1, wherein there are at least two thermosensitive devices placed apart from each other and in thermal contact with said tubular non-conducting body.

7. An integrating circuit for integrating a current, comprising:
    a. a coulometer which includes:
        i. an elongated electrically non-conducting tube defining a bore;
        ii. a column of a first material disposed in one end of said tube;
        iii. a column of a second material having a thermal conductivity different from the thermal conductivity of said first material, said second material being disposed in the other end of said tube in contact with said first material and defining an interface therebetween, said interface moving along the length of the coulometer when the coulometer is subjected to a DC current;
        iv. a first electrical conductor in contact with said first column of material; and
        v. a second electrical conductor in contact with said second column of material;
    b. means for subjecting said coulometer to an external source of heat;
    c. at least one thermosensitive device disposed adjacent said coulometer at a first point between said first and second conductors of said coulometer; and d. circuit means coupled to said thermosensitive device for providing a signal when the temperature sensed by said thermosensitive device changes.

8. An integrating circuit as in claim 7, wherein the column of said first material closes one end of said tube and a conducting enclosure of said first material closes the other end of said tube, and said second conductor contacts said second column of material via said conducting enclosure.

9. An integrating circuit as in claim 7, wherein at least two thermosensitive devices are positioned adjacent said coulometer at different points between said first and second conductors of said coulometer and in thermal contact with said coulometer.

10. An integrating circuit as in claim 9, wherein circuit means are coupled to said thermosensitive devices for detecting the position of said interface by monitoring the temperature at each of said temperature sensitive elements.

11. An integrating circuit as in claim 7, wherein said external source of heat is supplied by a heat source disposed adjacent said coulometer.

12. An integrating circuit as in claim 7, wherein the first material is a metal and the second material is an electrolyte.

13. An integrating circuit as in claim 12, wherein the metal is copper.

14. An integrating circuit as in claim 12, wherein the thermal conductivity of the metal is great in comparison with the thermal conductivity of the electrolyte.

15. In a coulometer, comprising an elongated electrically non-conducting tube, two electrodes, and a first material and a second material within said tube in series connection between said electrodes, said materials having different thermal conductivities, said second material contacting said first material and defining an interface therebetween, said interface moving along the length of the coulometer when the coulometer is subjected to a DC current, a method for reading said coulometer comprising the steps of:

conducting heat from a heat source through a portion of the coulometer to at least one thermosensitive device; and detecting the presence of said interface adjacent a point on said coulometer by monitoring temperature at said point.

16. In an integrating circuit which integrates current, a coulometer which includes a region having a first thermal conductivity disposed between two columns of material having a second thermal conductivity, said region moving along the length of the coulometer as material is deposited from one of said columns to the other of said columns when the coulometer is subjected to a DC current, a method for reading said coulometer comprising the steps of:

conducting heat from a heat source through a portion of the coulometer to at least one thermosensitive device; and detecting the proximity of said region adjacent a point on said coulometer by monitoring temperature at said point.

* * * * *